United States Patent
Zeng et al.

(10) Patent No.: US 10,446,413 B2
(45) Date of Patent: Oct. 15, 2019

(54) METHOD FOR ATTACHING WIRING PROTECTIVE FILM LAYER, WIRING STRUCTURE AND DISPLAY PANEL

(71) Applicants: BOE TECHNOLOGY GROUP CO., LTD., Beijing (CN); Chengdu BOE Optoelectronics Technology Co., Ltd., Chengdu, Sichuan (CN)

(72) Inventors: Mu Zeng, Beijing (CN); Tao Wang, Beijing (CN); Zhouping Wang, Beijing (CN); Guowen Yang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 0 days.

(21) Appl. No.: 15/745,815

(22) PCT Filed: Jun. 22, 2017

(86) PCT No.: PCT/CN2017/089525
§ 371 (c)(1),
(2) Date: Jan. 18, 2018

(87) PCT Pub. No.: WO2018/001162
PCT Pub. Date: Jan. 4, 2018

(65) Prior Publication Data
US 2018/0211847 A1   Jul. 26, 2018

(30) Foreign Application Priority Data

Jul. 1, 2016   (CN) .......................... 2016 1 0516113

(51) Int. Cl.
*H01L 21/56* (2006.01)
*G02F 1/1362* (2006.01)
(Continued)

(52) U.S. Cl.
CPC ............ *H01L 21/56* (2013.01); *G02F 1/1345* (2013.01); *G02F 1/136286* (2013.01);
(Continued)

(58) Field of Classification Search
CPC .................. H01L 21/56; H01L 27/3276; G02F 1/136286; G02F 2201/50
See application file for complete search history.

(56) References Cited

U.S. PATENT DOCUMENTS

| | | | |
|---|---|---|---|
| 2010/0155749 A1* | 6/2010 | Chen .................... | C09K 11/025 257/89 |
| 2012/0156436 A1* | 6/2012 | Kim ..................... | C09K 11/565 428/172 |

(Continued)

FOREIGN PATENT DOCUMENTS

| CN | 103215535 A | 7/2013 |
|---|---|---|
| CN | 103227270 A | 7/2013 |

(Continued)

OTHER PUBLICATIONS

Chinese First Office Action dated Dec. 21, 2017 corresponding to application No. 201610516113.6.

(Continued)

*Primary Examiner* — Jay C Chang
*Assistant Examiner* — Mikka Liu
(74) *Attorney, Agent, or Firm* — Nath, Goldberg & Meyer; Joshua B. Goldberg

(57) ABSTRACT

The present disclosure provides a method for attaching a wiring protective film layer, a wiring structure and a display panel. The attaching method comprises: forming a protective structure comprising a protective film layer and a carrier layer disposed in stack on a wiring layer, wherein the wiring (Continued)

layer and the protective film layer are in contact; and removing the carrier layer and remaining the protective film layer.

15 Claims, 3 Drawing Sheets

(51) Int. Cl.
 *H01L 23/498* (2006.01)
 *H01L 23/552* (2006.01)
 *H01L 27/32* (2006.01)
 *G02F 1/1345* (2006.01)

(52) U.S. Cl.
 CPC ........ *H01L 23/4985* (2013.01); *H01L 23/552* (2013.01); *H01L 27/3276* (2013.01); *G02F 2201/50* (2013.01)

(56) References Cited

U.S. PATENT DOCUMENTS

| | | |
|---|---|---|
| 2013/0217184 A1 | 8/2013 | Ishizuki et al. |
| 2017/0222182 A1* | 8/2017 | Mo ................ H01L 51/524 |

FOREIGN PATENT DOCUMENTS

| | | |
|---|---|---|
| CN | 104332416 A | 2/2015 |
| CN | 105164585 A | 12/2015 |
| CN | 105977170 A | 9/2016 |
| JP | 201098075 A | 4/2010 |
| JP | 2015233092 A | 12/2015 |
| WO | 2014175260 A1 | 10/2014 |

OTHER PUBLICATIONS

International Search Report dated Sep. 27, 2017 corresponding to application No. PCT/CN2017/089525.

* cited by examiner

METHOD FOR ATTACHING WIRING PROTECTIVE FILM LAYER, WIRING STRUCTURE AND DISPLAY PANEL

This is a National Phase Application filed under 35 U.S.C. 371 as a national stage of PCT/CN2017/089525, filed Jun. 22, 2017, an application claiming the benefit of Chinese Application No. 201610516113.6, filed Jul. 1, 2016, the content of each of which is hereby incorporated by reference in its entirety.

TECHNICAL FIELD

The present disclosure relates to the technical field of display apparatus technology, and particularly relates to a method for attaching a wiring protective film layer, a wiring structure and a display panel.

BACKGROUND OF THE INVENTION

For display screens such as LCDs and OLEDs, they are connected to an integrated circuit (IC) by their own peripheral circuits. The integrated circuit drives the display screens to display through the peripheral circuits thereof. After the crimping process of the integrated circuit is completed, the wiring layer of the display screen needs to be protected from electrochemical corrosion caused by erosion of external water vapor and resulting in malfunction of the display screen.

Current methods for protecting the wiring layer realizes the protection by, for example, coating a protective glue (UV glue) on the wiring layer to form a protective glue layer and curing the protective glue layer.

Since the protective glue has a greater viscosity, the protective glue layer obtained by the above method typically has a height of 0.1 to 0.25 mm. However, in order to be foldable, a flexible display screen product is generally required to have a protective glue layer with a thickness less than 30 µm. Thus, the thickness of the above protective glue layer cannot meet technical requirements for a flexible display screen product.

The present disclosure has been accomplished in order to at least partially solve the problems in the prior art. The present disclosure provides a method for attaching a wiring protective film layer, a wiring structure and a display panel that can not only protect the wiring structure of the display screen, but also meet technical requirements for a flexible display screen product.

According to one aspect of the disclosure, there is provided a method for attaching a wiring protective film layer comprising:

step S1: forming a protective structure comprising a protective film layer and a carrier layer disposed in stack on a wiring layer, wherein the wiring layer and the protective film layer are in contact; and step S2: removing the carrier layer and remaining the protective film layer.

After the step S2, the method for attaching a wiring protective film layer may further comprise:

step S3: curing the protective film layer.

During step S3, curing the protective film layer may be performed by UV or ozone curing.

The Step S1 may comprise:

step S11: cutting a thin film of the protective film layer to form the protective film layer, but not cutting a thin film of the carrier layer disposed in stack with the thin film of the protective film layer, a part of the thin film of the carrier layer corresponding to the protective film layer being the carrier layer; and step S12: attaching the protective film layer and the carrier layer disposed in stack onto the wiring layer.

The step S12 may comprise:

attaching the protective film layer and the carrier layer disposed in stack onto the wiring layer by a pressure head device.

After the step S1 and before step S2, the method for attaching a wiring protective film layer may further comprise:

step S41: removing any bubble between the protective film layer and the wiring layer.

The step S41 may comprise:

removing the bubble using a resilient attaching roller rolling on the protective film layer.

After the step S2 and before the step S3, the method for attaching a wiring protective film layer may further comprise:

step S42: removing any bubble between the protective film layer and the wiring layer.

The step S42 may comprise:

removing the bubble using a resilient attaching roller rolling on the protective film layer.

After the step S2, the method for attaching a wiring protective film layer may further comprise:

recovering the carrier layer by means of reel rotation.

The Step S2 may comprise:

peeling off the carrier layer carrying the protective film layer by a peeling device comprising two peeling rods respectively provided on upper and lower sides of the carrier layer.

According to another aspect of the disclosure, there is provided a wiring structure comprising:

a wiring layer; and a protective structure comprising a protective film layer and to be attached using the above method for attaching a wiring protective film layer of the disclosure so that the wiring layer and the protective film layer are in contact.

The protective film layer may have a thickness no greater than approximately 30 µm.

According to still another aspect of the disclosure, there is provided a display panel comprising the above wiring structure of the disclosure.

The wiring structure is located at a non-display area of the display panel.

DETAILED DESCRIPTION

To improve understanding of the technical solution of the present disclosure for those skilled in the art, the method for attaching a wiring protective film layer, the wiring structure and the display panel provided in the disclosure will be described below in detail in conjunction with the accompanying drawings.

Figure 1:
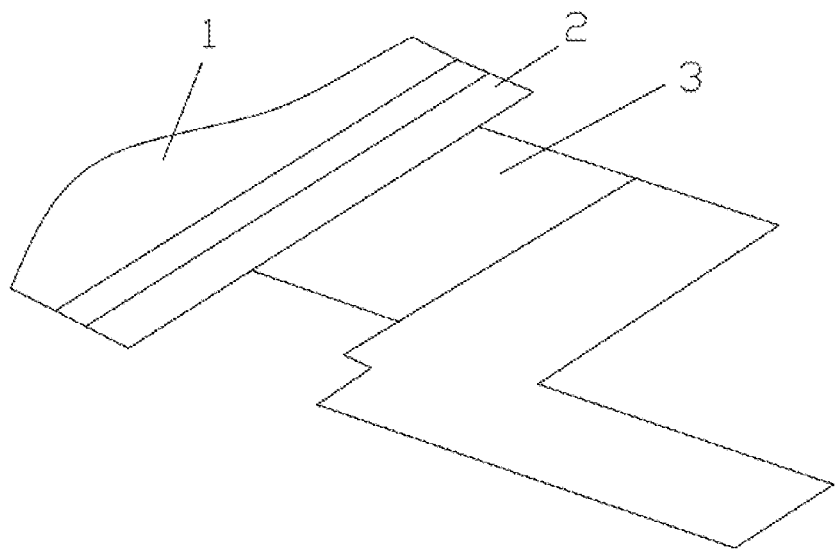
FIG. 1 is a structural schematic view showing the wiring structure according to an exemplary embodiment of the disclosure.
Figure 2:
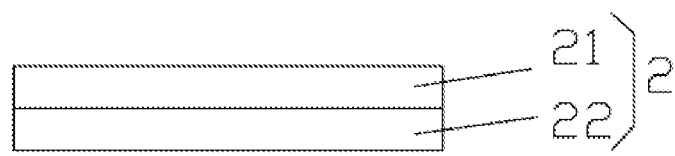
FIG. 2 is a structural schematic view showing the protective structure according to an exemplary embodiment of the disclosure.
Figure 3:
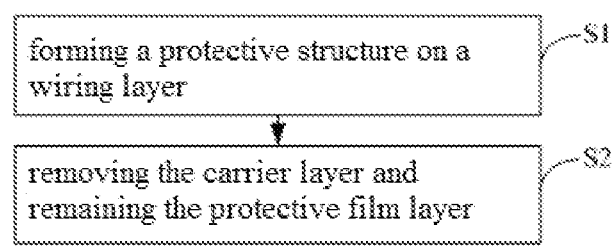
FIG. 3 is a flow chart showing the method for attaching a wiring protective film layer according to an exemplary embodiment of the disclosure.

FIG. 1 is a structural schematic view showing the wiring structure according to an exemplary embodiment of the disclosure. FIG. 2 is a structural schematic view showing the protective structure according to an exemplary embodiment of the disclosure. FIG. 3 is a flow chart showing the method for attaching a wiring protective film layer according to an exemplary embodiment of the disclosure. As shown in FIG. 1, the display screen is connected to an integrated circuit 3 via a wiring layer 1 disposed at a periphery thereof. According to one aspect of the disclosure, in order to protect the wiring layer 1 of the display screen, as shown in FIG. 3, the disclosure provides a method for attaching a wiring protective film layer comprising:

step S1: forming a protective structure 2 on the wiring layer. As shown in FIG. 2, the protective structure 2 includes a protective film layer 21 and a carrier layer 22 disposed in stack, wherein the wiring layer 1 and the protective film layer 21 are in contact;

step S2: removing the carrier layer 22 and remaining the protective film layer 21.

Since the carrier layer 22 of the protective structure 2 is removed, and the remaining protective film layer 21 is very thin (no greater than approximately 30 μm in thickness), it not only protects the wiring layer 1 of the display screen, but also meets technical requirements for a flexible display screen product.

Figure 4A:
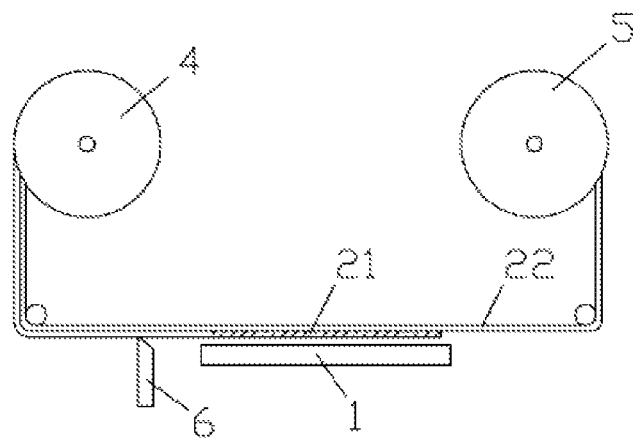
FIG. 4A is a schematic view showing the partially cutting step according to an exemplary embodiment of the disclosure.
Figure 4B:
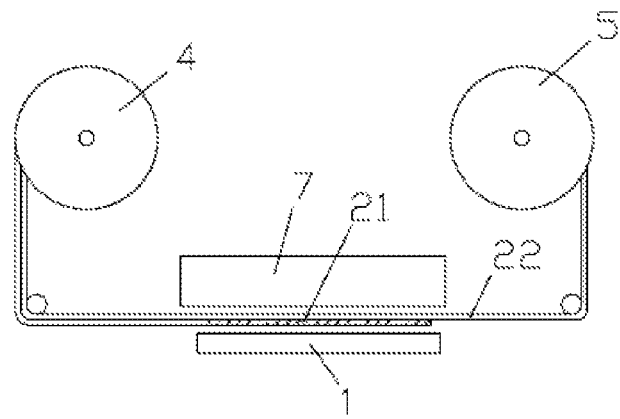
FIG. 4B is a schematic view showing the attaching step according to an exemplary embodiment of the disclosure.
Figure 4C:
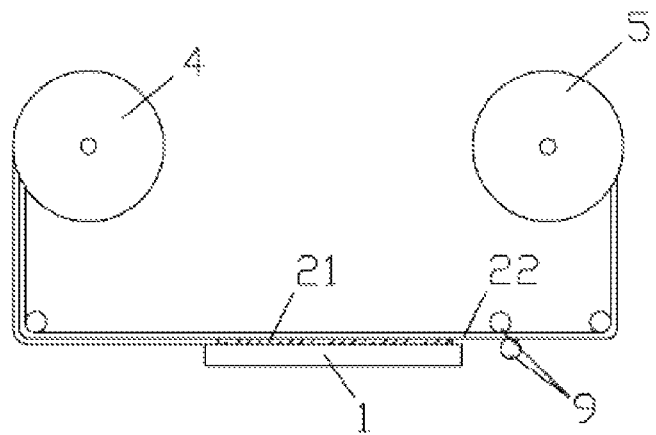
FIG. 4C is a schematic view showing the peeling step according to an exemplary embodiment of the disclosure.
Figure 4D:
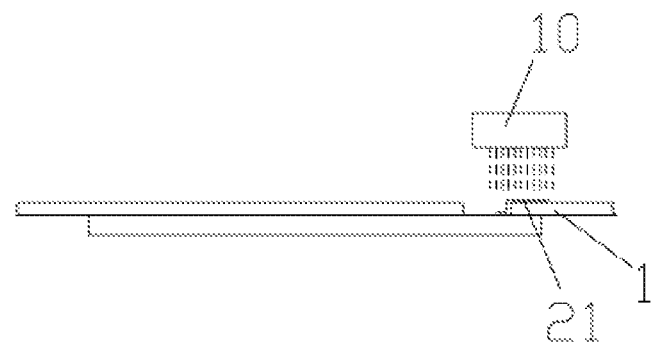
FIG. 4D is a schematic view showing the curing step according to an exemplary embodiment of the disclosure.

FIG. 4A is a schematic view showing the partially cutting step according to an exemplary embodiment of the disclosure. FIG. 4B is a schematic view showing the attaching step according to an exemplary embodiment of the disclosure. FIG. 4C is a schematic view showing the peeling step according to an exemplary embodiment of the disclosure. FIG. 4D is a schematic view showing the curing step according to an exemplary embodiment of the disclosure. Specifically, in an exemplary embodiment according to the disclosure, the step S1 includes:

step S11: cutting a thin film of the protective film layer to form the protective film layer 21, but not cutting a thin film of the carrier layer disposed in stack with the thin film of the protective film layer, a part of the thin film of the carrier layer corresponding to the protective film layer 21 being the carrier layer 22;

step S12: attaching the protective film layer 21 and the carrier layer 22 disposed in stack onto the wiring layer 1.

In the exemplary embodiment according to the disclosure, in the step S11, as shown in FIG. 4A, a feed reel 4 is used for feeding the thin films of the protective film layer and the carrier layer disposed in stack. Specifically, by rotating the feed reel 4, the thin films of the protective film layer and the carrier layer disposed in stack are transported above the wiring layer 1. Then, when the thin films of the protective film layer and the carrier layer 22 disposed in stack get through, a partial cutter 6 is used for cutting a thin film of the protective film layer to form the protective film layer 21, but not cutting the thin film of the carrier layer disposed in stack with the thin film of the protective film layer, a part of the thin film of the carrier layer corresponding to the protective film layer 21 being the carrier layer 22.

In the exemplary embodiment according to the disclosure, in the step S12, as shown in FIG. 4B, a pressure head device 7 may be used for attaching the protective film layer 21 and the carrier layer disposed in stack onto the wiring layer 1.

When the step S12 is finished, as shown in FIG. 4C, the step S2 further includes: using a peeling device, for example, a peeling rod 9, to peel off the carrier layer 22 carrying the protective film layer 21. In addition, when the carrier layer 22 is peeled off, the carrier layer 22 may be recovered by rotating a recovery reel 5. There are two peeling rods 9 respectively disposed on upper and lower sides of the thin film of the carrier layer, and a space between the two peeling rods 9 merely allows the carrier layer to pass through. Meanwhile, the peeling rod 9 at the lower side of the thin film of the carrier layer is provided with a peeling tool (not shown) for peeling off the thin film of the carrier layer from the protective film layer 21 during a forward movement of the thin film of the carrier layer.

When the step S2 is finished, as shown in FIG. 4D, the method for attaching a wiring protective film layer of the disclosure further includes step S3; curing the protective film layer 21. Specifically, a curing device 10 may be used for curing the protective film layer 21. The curing device 10 may be a UV lamp or ozone lamp for curing the protective film layer 21 by UV or ozone curing.

Figure 5:
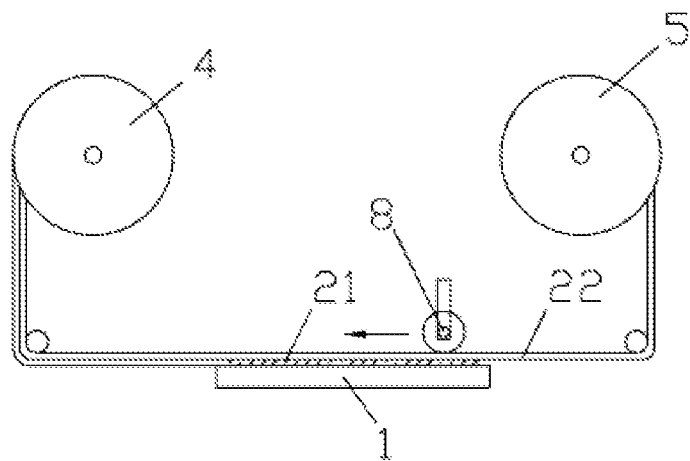
FIG. 5 is a schematic view showing the rolling step according to an exemplary embodiment of the disclosure.

In the exemplary embodiment according to the disclosure, FIG. 5 is a schematic view showing the rolling step according to an exemplary embodiment of the disclosure. After the step S1 and before the step S2, or after the step S2 and before the step S3, the method for attaching a wiring protective film layer of the disclosure further includes:

removing any bubble between the protective film layer 21 and the wiring layer 1.

As shown in FIG. 4D, the attached protective film layer 21 has a stepped structure where bubbles are easy to occur, in particular at an end of the wiring layer 1. In the exemplary embodiment according to the disclosure, as shown in FIG. 5, the bubble is removed using a resilient attaching roller 8 rolling on the protective film layer 21.

Figure 6:
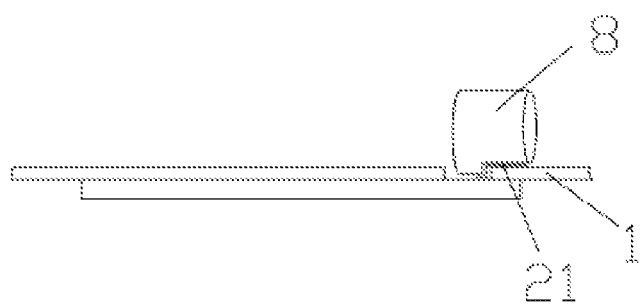
FIG. 6 is a schematic view showing deformation of the attaching roller during rolling in the rolling step according to an exemplary embodiment of the disclosure.

In the exemplary embodiment according to the disclosure, FIG. 6 is a schematic view showing deformation of the attaching roller during rolling in the rolling step according to an exemplary embodiment of the disclosure. As shown in FIG. 6, the resilient attaching roller 8 is rolled on the protective film layer 21 so that a surface of the attaching roller 8 is guaranteed to contact all surfaces of the protective film layer 21. It can be seen from FIG. 6 that the attaching roller 8 deforms while rolling on the protective film layer 21 due to the stepped structure on the surface of the protective film layer 21. Due to this deformation, the surface of attaching roller 8 contacts surfaces of the protective film layer 21 not only in a horizontal direction, but also in a vertical direction, i.e., contacting a vertical surface at the stepped structure, so that bubbles at the stepped structure of the protective film layer 21 are effectively removed.

According to another aspect of the disclosure, the present disclosure also provides a wiring structure that, as shown in FIG. 1, comprises a wiring layer 1. The wiring layer 1 is connected to an integrated circuit 3 so that the integrated circuit 3 can drive a display screen to display. Further, in order to protect the wiring layer 1, the wiring structure further includes a protective structure 2 disposed on the wiring layer 1. The protective structure 2 includes a protective film layer 21 and is attached using the above mentioned method for attaching a wiring protective film layer so that the protective film layer 21 and the wiring layer 1 are in contact. The protective film layer 21 has a thickness no greater than approximately 30 μm.

Since the carrier layer 22 of the protective structure 2 is removed, and the remaining protective film layer 21 is very thin, it not only protects the wiring layer 1, but also meets technical requirements for a flexible display screen product.

According to still another aspect of the disclosure, the present disclosure also provides a display panel comprising the above wiring structure of the disclosure.

In the exemplary embodiment according to the disclosure, the wiring structure is located at a non-display area of the display panel. Specifically, the wiring structure is located at an area of the display panel to be attached by a flexible circuit board (FPC).

The display panel of the disclosure comprises the above wiring structure of the disclosure, so the display panel can protect the wiring structure as well as meet technical requirements for a flexible display screen product.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A method for attaching a wiring protective film layer comprising:
   step S1: forming a protective structure comprising a protective film layer and a carrier layer disposed in stack on a wiring layer, wherein the wiring layer and the protective film layer are in contact;
   step S2: removing the carrier layer and remaining the protective film layer; and recovering the carrier layer by means of reel rotation.

2. The method for attaching a wiring protective film layer according to claim 1,
   wherein after the step S2, the method for attaching a wiring protective film layer further comprises:
   step S3: curing the protective film layer.

3. The method for attaching a wiring protective film layer according to claim 2,
   wherein the step of curing the protective film layer is performed by UV curing.

4. The method for attaching a wiring protective film layer according to claim 2,
   wherein the step of curing the protective film layer is performed by ozone curing.

5. The method for attaching a wiring protective film layer according to claim 2,
   wherein after the step S2 and before the step S3, the method for attaching a wiring protective film layer further comprises:
   step S42: removing any bubble between the protective film layer and the wiring layer.

6. The method for attaching a wiring protective film layer according to claim 5,
   wherein the step S42 comprises:
   removing the bubble using a resilient attaching roller rolling on the protective film layer.

7. The method for attaching a wiring protective film layer according to claim 1,
   wherein the step S1 comprises:
   step S11: cutting a protective film to form the protective film layer, but not cutting a carrier film disposed in stack with the protective film, a part of the carrier film corresponding to the protective film layer being the carrier layer; and
   step S12: attaching the protective film layer and the carrier layer disposed in stack onto the wiring layer.

8. The method for attaching a wiring protective film layer according to claim 7,
   wherein the step S12 comprises:
   attaching the protective film layer and the carrier layer disposed in stack onto the wiring layer by a pressure head device.

9. The method for attaching a wiring protective film layer according to claim 1,
   wherein after the step S1 and before the step S2, the method for attaching a wiring protective film layer further comprises:
   step S41: removing any bubble between the protective film layer and the wiring layer.

10. The method for attaching a wiring protective film layer according to claim 9,
    wherein the step S41 comprises:
    removing the bubble using a resilient attaching roller rolling on the protective film layer.

11. The method for attaching a wiring protective film layer according to claim 1,
    wherein the step S2 comprises:
    peeling off the carrier layer carrying the protective film layer by a peeling device comprising two peeling rods respectively provided on upper and lower sides of the carrier layer.

12. A wiring structure, comprising:
    a wiring layer; and
    a protective structure comprising a protective film layer and to be attached using the method for attaching a wiring protective film layer according to claim 1 so that the wiring layer and the protective film layer are in contact.

13. The wiring structure according to claim 12,
    wherein the protective film layer has a thickness no greater than approximately 30 μm.

14. A display panel, comprising the wiring structure according to claim 12.

15. The display panel according to claim 14,
    wherein the wiring structure is located at a non-display area of the display panel.

* * * * *